(12) United States Patent
Hinnen et al.

(10) Patent No.: US 9,217,916 B2
(45) Date of Patent: Dec. 22, 2015

(54) LITHOGRAPHIC APPARATUS AND DEVICE MANUFACTURING METHOD

(75) Inventors: Paul Christiaan Hinnen, Veldhoven (NL); Marcus Adrianus Van De Kerkhof, Helmond (NL); Reiner Maria Jungblut, Taipei (TW); Koenraad Remi André Maria Schreel, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 800 days.

(21) Appl. No.: 13/568,645

(22) Filed: Aug. 7, 2012

(65) Prior Publication Data

US 2012/0300182 A1    Nov. 29, 2012

Related U.S. Application Data

(62) Division of application No. 12/707,104, filed on Feb. 17, 2010, now Pat. No. 8,263,296.

(60) Provisional application No. 61/155,668, filed on Feb. 26, 2009.

(51) Int. Cl.
  *G03B 27/32* (2006.01)
  *G03B 27/34* (2006.01)
  *G03F 7/207* (2006.01)
  *G03F 7/20* (2006.01)

(52) U.S. Cl.
  CPC ............... *G03B 27/32* (2013.01); *G03B 27/34* (2013.01); *G03F 7/70625* (2013.01); *G03F 7/70641* (2013.01)

(58) Field of Classification Search
  CPC ..... G03B 27/32; G03B 27/34; G03F 7/70625; G03F 7/70641
  USPC ........................................ 355/55, 67; 430/30
  See application file for complete search history.

(56) References Cited

U.S. PATENT DOCUMENTS

| 6,795,163 | B2 | 9/2004 | Finders |
| 8,263,296 | B2 | 9/2012 | Hinnen et al. |
| 2010/0233599 | A1 | 9/2010 | Hinnen et al. |

OTHER PUBLICATIONS

Notice of Allowance mailed May 16, 2012 for U.S. Appl. No. 12/707,104, filed Feb. 17, 2010; 7 pages.

*Primary Examiner* — Christopher Young
(74) *Attorney, Agent, or Firm* — Sterne, Kessler, Goldstein & Fox P.L.L.C

(57) ABSTRACT

A lithographic system includes a monitored lithographic projection apparatus arranged to project a patterned beam onto a substrate. A scatterometer measures a plurality of parameters of the pattern transferred to the substrate including at least one CD-profile parameter and at least one further parameter of the pattern transferred to the substrate which is indicative of a machine setting of the monitored lithographic projection apparatus. A matching system includes a database storing information representative of reference CD values and reference values for the further feature. A comparison arrangement compares the measured values with the corresponding stored values, a lithographic parameter calculation means calculating a corrected set of machine settings for the monitored lithographic apparatus dependent on the differences between the measured and reference values.

14 Claims, 7 Drawing Sheets

# LITHOGRAPHIC APPARATUS AND DEVICE MANUFACTURING METHOD

CROSS REFERENCE TO RELATED APPLICATIONS

This application is a divisional of U.S. patent application Ser. No. 12/707,104, filed Feb. 17, 2010 (now U.S. Pat. No. 8,263,296), which claims the benefit under 35 U.S.C. §119(e) of U.S. Provisional Application No. 61/155,668, filed Feb. 26, 2009, which are incorporated by reference herein in their entireties

BACKGROUND

1. Field of the Invention

The present invention relates to a lithographic apparatus and a method for manufacturing a device. Embodiments of the invention have particular relevance to a method and apparatus for adjusting the settings of the lithographic apparatus.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Where a manufacturing facility has more than one lithographic apparatus used for printing the same product types, it is desirable to be able to match the characteristics of all the lithographic apparatus to each other. This will allow the apparatus to be used in a "mix and match" configuration, in which the apparatus may be arranged to have the same optical transfer function.

In one lithographic manufacturing process, a first lithographic transfer function of a first lithographic projection apparatus is obtained. The information is compared with information relating to a second lithographic transfer function corresponding to a second lithographic projection apparatus, which acts as a reference apparatus. The lithographic transfer function describes the transfer of spatial frequencies from the pattern on the mask to the pattern projected on the substrate. The difference between the first and second information is calculated. Machine settings for the first lithographic apparatus are changed in order to minimize the difference so as to improve the match between the first and second lithographic projection apparatus. The information that is obtained on each of the first and second projection apparatus is critical dimension (CD) pitch anomaly. Variations in CD pitch can occur as a function of variations in the machine settings of a lithography apparatus, such as exposure energy and illumination settings.

However, there is a problem with this method of matching two lithographic projection apparatus in that the measurement of CD does not allow discrimination of the various lithographic projection apparatus parameters, thus leading to errors.

SUMMARY

It is desirable to provide a method for allowing two lithographic projection apparatus to be matched, which may be made more accurate than the previously known methods.

According to a first embodiment, there is provided a lithographic system comprising a monitored lithographic projection apparatus, a metrology apparatus, and a matching system. The monitored lithographic projection apparatus is arranged to project a patterned beam of radiation onto a substrate. The metrology apparatus is arranged to measure values representative of a plurality of features of the pattern transferred to the substrate including values of at least one CD-profile parameter and at least one further feature profile parameter which is indicative of a machine setting of the monitored lithographic projection apparatus. The matching system comprises a storage system, a comparison system, and a lithographic parameter calculation system. The storage system stores a reference CD-profile parameter value representative of the CD-profile parameter and a reference feature profile value representative of the one further feature profile parameter. The comparison system compares the measured and reference values of the one further feature profile parameter. The lithographic parameter calculation system calculates a corrected set of machine settings for use by the monitored lithographic apparatus dependent on the differences between the measured and reference values of the one further feature profile parameter and between the measured and reference values of the CD-profile parameter.

According to a second embodiment, there is provided a matching system for use in a lithographic system comprising a monitored lithographic projection apparatus, a metrology apparatus and the matching system. The monitored lithographic projection apparatus is arranged to project a patterned beam of radiation onto a substrate. The metrology apparatus is arranged to measure values representative of a plurality of features of the pattern transferred to the substrate including at least one CD-profile parameter and at least one further feature profile parameter which is indicative of a machine setting of the monitored lithographic projection apparatus. The matching system comprises a storage system, a comparison system, and a lithographic parameter system. The storage system stores a reference CD-profile parameter value representative of the CD-profile parameter and a reference feature profile value representative of the one further feature profile parameter. The comparison system compares the measured and reference values of the one further feature profile parameter. The lithographic parameter calculation system calculates a corrected set of machine settings for use by the monitored lithographic apparatus dependent on the differences between the measured and reference values of the one further feature profile parameter and between the measured and reference values of the CD-profile parameter.

According to a third embodiment, there is provided a device manufacturing method comprising the following steps. Projecting a patterned beam of radiation onto a substrate. Measuring values representative of a plurality of features of the pattern transferred to the substrate including values of at least one CD-profile parameter and at least one further feature profile parameter which is indicative of a machine setting of a monitored lithographic projection apparatus. Storing a reference CD-profile parameter value and a reference feature profile value representative of the one further feature profile parameter. Comparing the measured and reference values of the one further feature profile parameter. Calculating a corrected set of machine settings for use by the monitored lithographic apparatus dependent on the differences between the measured and reference values of the one further feature profile parameter and between the measured and reference values of the CD-profile parameter. Correcting the values of the machine settings according to the corrected set of machine settings.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention FIG. 1 depicts a lithographic projection apparatus, according to an embodiment of the invention.

Figure 1:
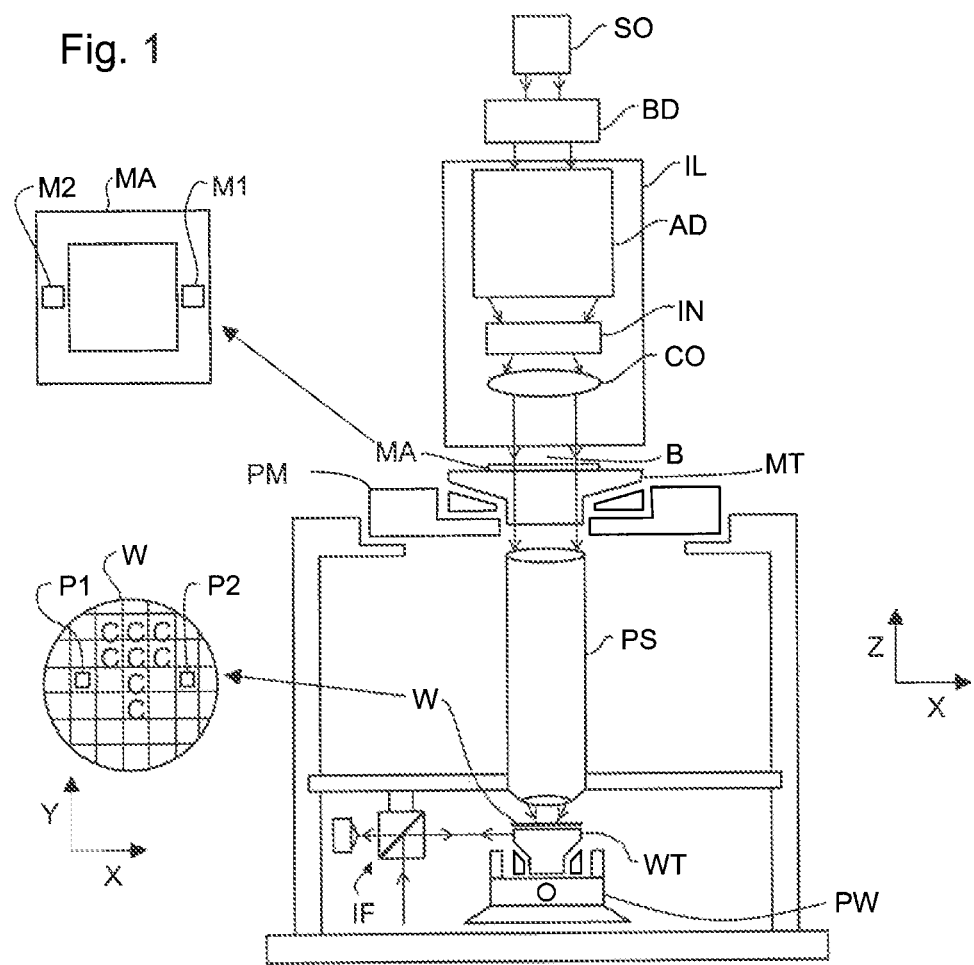

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the invention. The apparatus comprises an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
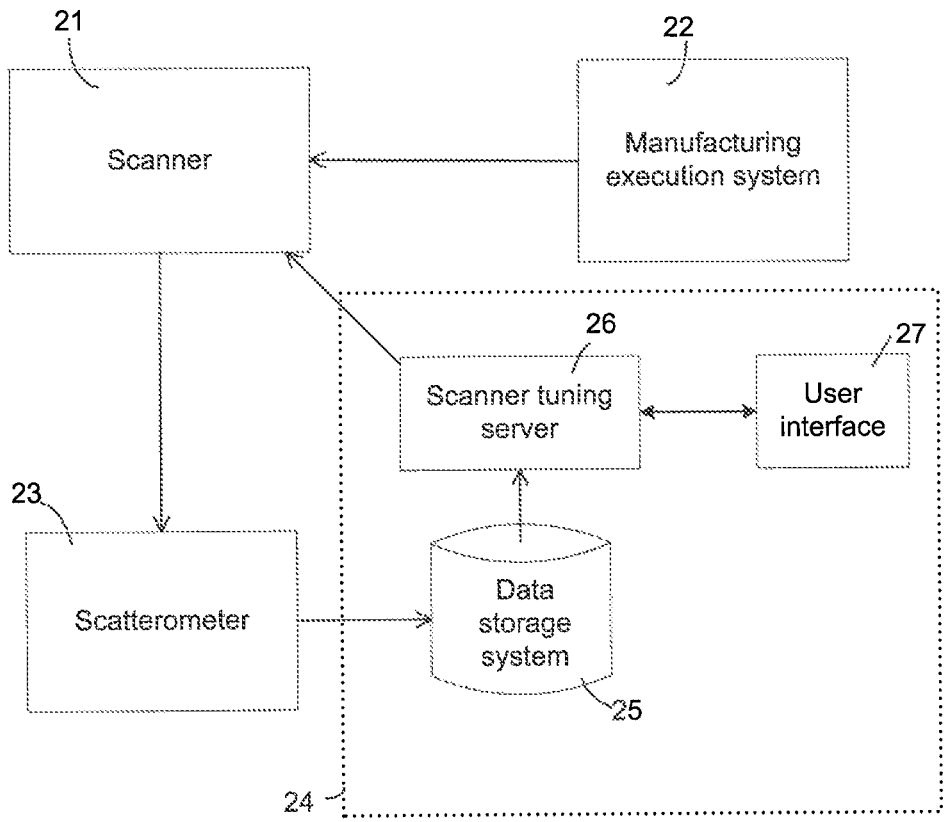
FIG. 2 is a flow diagram depicts the apparatus of FIG. 1 incorporated in a system which may be used in a method in accordance with an embodiment of the invention allowing the characteristics of the apparatus to be matched to those of a reference lithographic projection apparatus.

FIG. 2 is a flow diagram depicts the apparatus of FIG. 1 incorporated in a system which may be used in a method in accordance with an embodiment of the invention allowing the characteristics of the apparatus to be matched to those of a reference lithographic projection apparatus. In order to match the characteristics of the lithography apparatus with a reference lithography apparatus a matching system may be used. The matching system matches the characteristics of test wafers produced by the lithography apparatus with the wafers produced by a reference lithography apparatus. The matching allows adjustments to be made to the lithography apparatus in order to match the lithographic transfer functions of the two lithography apparatus. In the particular system to be described by way of example, the lithography apparatus is a scanner, although it will be appreciated that the embodiments of the invention is applicable to other types of lithography apparatus, for example steppers.

A lithography system discussing in general transfer functions can be found in U.S. Pat. No. 6,795,163, which is incorporated herein by reference in its entirety.

In the example shown in FIG. 2, a scanner 21 to be matched is responsive to instructions from a manufacturing execution system 22. Wafers produced by the scanner 21 are measured by a metrology tool in the form of a scatterometer 23. Profile information from the scatterometer is fed to a lithographic apparatus matching system indicated generally as 24. The lithographic apparatus matching system 24 includes a data storage system 25, a scanner tuning system 26, and a user interface 27.

Figure 3:
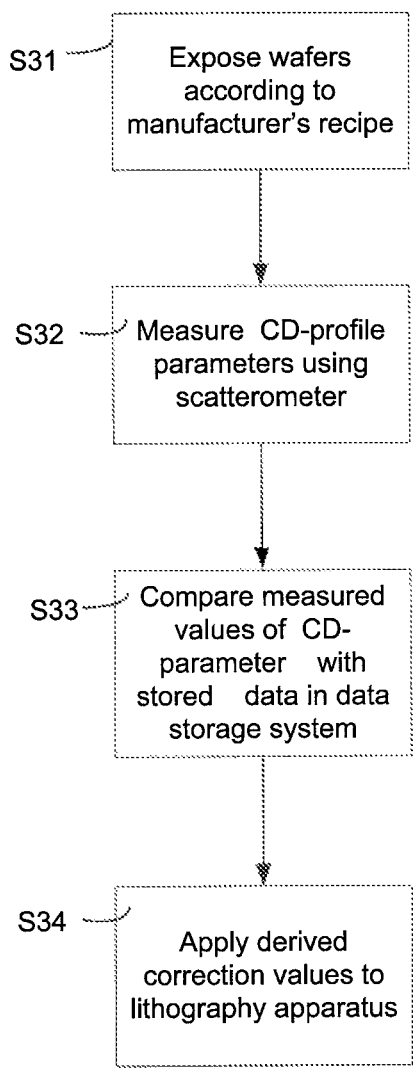
FIG. 3 illustrates a method of matching a lithographic projection apparatus to a reference lithographic projection apparatus using the system shown in FIG. 2, according to an embodiment of the present invention.

FIG. 3 illustrates the process steps carried out by the system shown in FIG. 2, according to one embodiment of the present invention. In step S31, wafers are exposed according to a manufacturer's recipe provided to the scanner 21 by the manufacturing executing system 22 and CD-profile parameter values of the wafers are measured using the scatterometer 23 in step S32. In step S33, the measured values of the CD-profile parameters are compared with values of the parameters for the reference scanner, which are stored in the customer file system 25. The scanner tuning server 26 derives correction values to change the recipe for exposing the wafers applied by the scanner 21 in step S34. The wafers are then re-measured, to determine if the scanner being set up sufficiently matches the lithography the reference scanner, either automatically or using user intervention via user instructions input via the user interface 27. For example, this can be done by comparing the lithography transfer functions of the two scanners or by other methods such as by comparing the proximity (delta) curves, which are a plot of CD-profile parameter values as a function of pitch, i.e., the inverse of the spatial frequency, for the two scanners.

Figure 4:
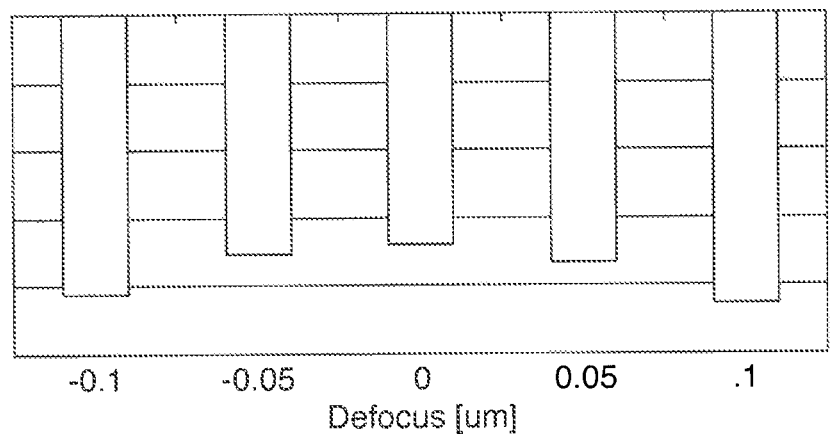
FIG. 4 depicts the sensitivity of a one dimensional target to sigma center variations for various focus states of the lithographic process carried out in the apparatus in FIG. 1, according to an embodiment of the present invention.

FIG. 4 depicts the sensitivity of a one dimensional target to sigma center variations for various focus states of the lithographic process carried out in the apparatus in FIG. 1, according to an embodiment of the present invention. In one example, measurement of CD-profile parameter value alone does not allow for scanner parameters and process parameters to be discriminated so as to allow a scanner to be accurately matched with the parameters of a reference scanner. In one example, a sensitivity of a one-dimensional target to variations in sigma-center, that is (σ-outer+σ-inner)/2. In this example, the sensitivity is shown for various focus states of the lithography process. It can be seen that as the defocus increases, there is an increase in sensitivity to sigma-center. It can be shown that other features of the pattern on the wafer can be correlated with values of the machine settings.

In accordance with an embodiment of the present invention, in addition to the CD-profile parameter value measurements, values representative of one or more process or scanner related parameters which may be derived from features of the pattern formed on the wafer, are also measured and matched against the corresponding stored values obtained from a reference scanner or against stored values obtained from an earlier run of the monitored scanner. In this example, it is possible to take account of the sensitivity of feature profile parameters of the pattern to process related parameters, such as the focus state, or dose state of the lithography process or lithography apparatus related parameters, such as numerical aperture (NA) and sigma.

In accordance with an embodiment of the present invention, in addition to measurement of the CD-parameter values by the metrology tool 23, parameters of the exposed resist on the wafer can be measured. For example, side wall angle (SWA), resist height and the underlying layer thicknesses (dependent on the stack being measured), such as oxide layer thicknesses, nitride layer thicknesses and BARC thicknesses, together with optical constants such as n and k, are compared to corresponding values for the reference scanner.

Figure 5:
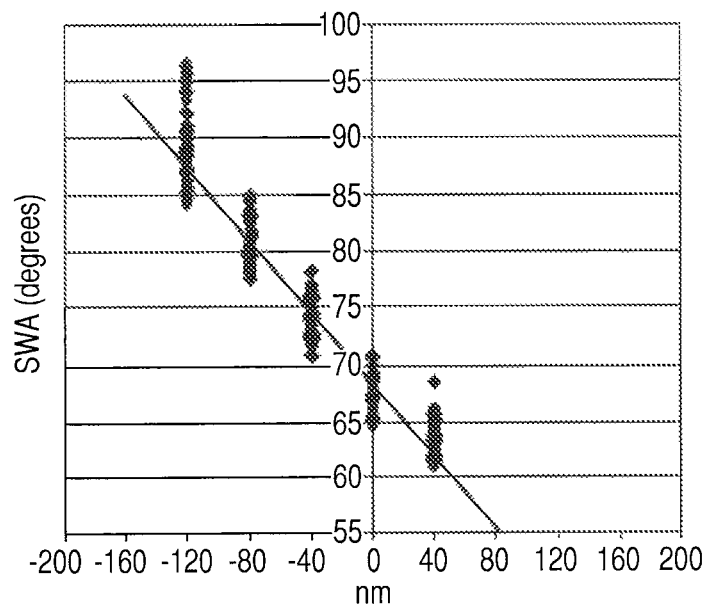
FIG. 5 illustrates a variation of side wall angle (SWA) as a function of the focus setting, according to an embodiment of the present invention.

FIG. 5 illustrates a variation of side wall angle (SWA) as a function of the focus setting, according to an embodiment of the present invention. In one example, there is a correlation between side wall angle (SWA) of features formed by the resist and focus setting. Thus, it is possible to use SWA information to determine the focus state of the lithocluster comprising the lithography apparatus and the track, in particular a combination of the scanner focal plane in combination with the used resist processing stability. As a variation in resist processing can lead to a difference in lithographic transfer function. This may be detected from the profile information given by the measured features. For example, the relationship between the remaining resist of a particular feature and the scanner defocus may vary compared to that for a feature of a different pitch. Thus, a change in the processing parameters can be monitored and possibly be compensated for.

Figure 6:
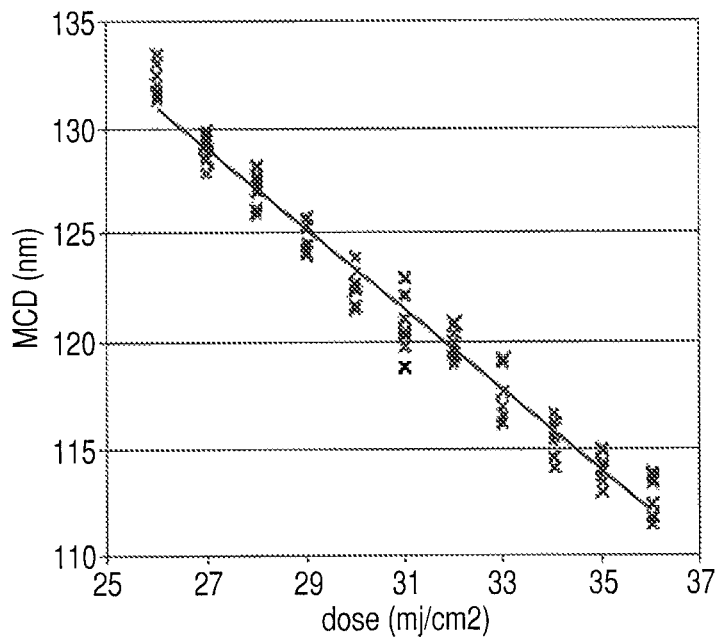
FIG. 6 illustrates the difference in mid critical dimension (mid-CD) as a function of the dose, according to an embodiment of the present invention.

FIG. 6 illustrates the difference in mid critical dimension (mid-CD) as a function of the dose, according to an embodiment of the present invention. In one example, the mid-CD profile parameter, that is the measured CD at half height of the resist feature assuming the reconstructed line profile is a simple trapezium, can be used to determine the dose state of the lithocluster. It will be appreciated that, while FIG. 6 illustrates the influence of the value of the mid-CD parameter on the dose, values of other parameters like the bottom CD, or top CD or any other CD value may be measured. Furthermore more complex profiles, other than a simple trapezium are possible.

Figure 7:
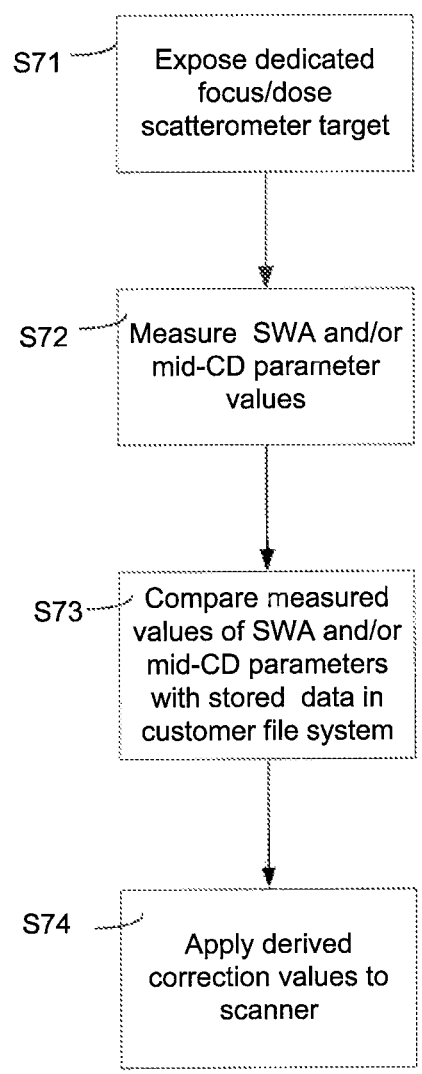
FIG. 7 depicts a method of matching two scanners, according to an embodiment of the present invention.

FIG. 7 depicts a method of matching two scanners, according to an embodiment of the present invention. In one example, dedicated focus and/or dose targets on a wafer may be used to separate out the focus and/or dose from the other scanner related parameters. Thus, in step S71, the dedicated focus and/or dose targets on a wafer, or possibly separate wafers, are exposed by the monitored scanner 21 and the SWA and/or mid-CD measured by a scatterometer in step S72. The values are compared with stored values of the SWA and/or mid-CD, which have been previously measured for a reference scanner in step S73. The acquired profile information may be used to allow dedicated focus adjustment of the monitored scanner in step S74 either by a mathematically modeled correction using the previously measured SWA-focus characteristic of the reference scanner or by physically adjusting the monitored scanner and exposing one or more further test wafers. Additionally, or alternatively, a procedure may be performed for the mid-CD/dose measurements.

It will be appreciated that alternatively or additionally to monitoring focus and dose as described above, dedicated process monitor targets, such as numerical aperture NA and sigma gauges, can be used to separate scanner related parameters such as NA and sigma from general process related parameters such as resist processing variations such as coat thickness variations, post exposure bake (PEB) delays and PEB nonuniformities. Furthermore, using different reticle biased targets having the same pitch but with the CD/pitch ratio varied, will allow the different parts of the lithography transfer function to be distinguished. Since the pitch is the same, the light traveling through the scanner follows the same optical path. The effect of the processing on the resist and the sensitivity of the various scanner parameters, such as NA, sigma, focus etc. depends also on the CD/pitch ratio, measurement of the CD/pitch ratio thus yielding further information.

Figure 8:
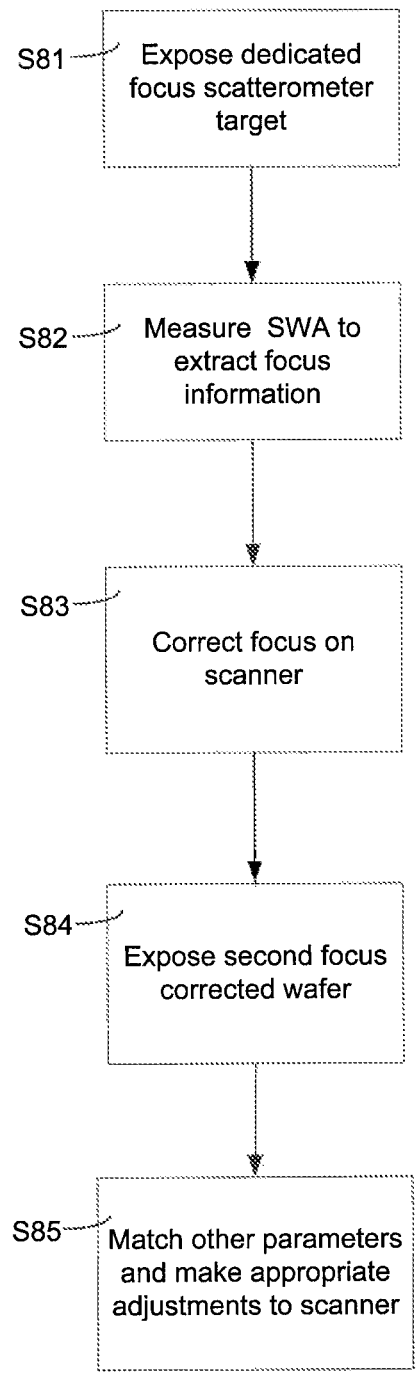
FIG. 8 depicts a method of matching two scanners, according to an embodiment of the present invention.

FIG. 8 depicts a method of matching two scanners, according to an embodiment of the present invention. In one example, optimization of the machine settings of the monitored scanner may be performed in several ways. In the particular example shown in FIG. 8, at least one dedicated focus scatterometer target on a wafer is exposed in step S81 and the SWA measured to extract the relevant focus information in step S82 as described above. The focus of the scanner is then corrected in step S83 and a second wafer exposed and used to derive other parameter values, in particular CD.

Alternatively the various parameters may be measured as set out above. All the parameters including the SWA sensitivity of all the variable machine settings may be put into an optimization program using the measured and reference profile values leading to an optimized machine setting.

It will be appreciated that while scanner matching is generally performed once at setup, with scanner stability being assumed, scanner matching may be performed periodically or in response to a scanner maintenance or upgrade action. There is a possibility that scanner parameters such as NA, sigma may drift with time, as may the lithography process in general. This will show up as a variation of the lithographic transfer function with time, as well as other measurements such as the proximity (delta) curve. A method in accordance with an embodiment of the invention may be used to monitor a scanner for any such variations and to make corrections during the use of the scanner. Thus, the characteristics of the scanner may be compared with its own previous characteristics, rather than those of a different reference scanner.

Figure 9:
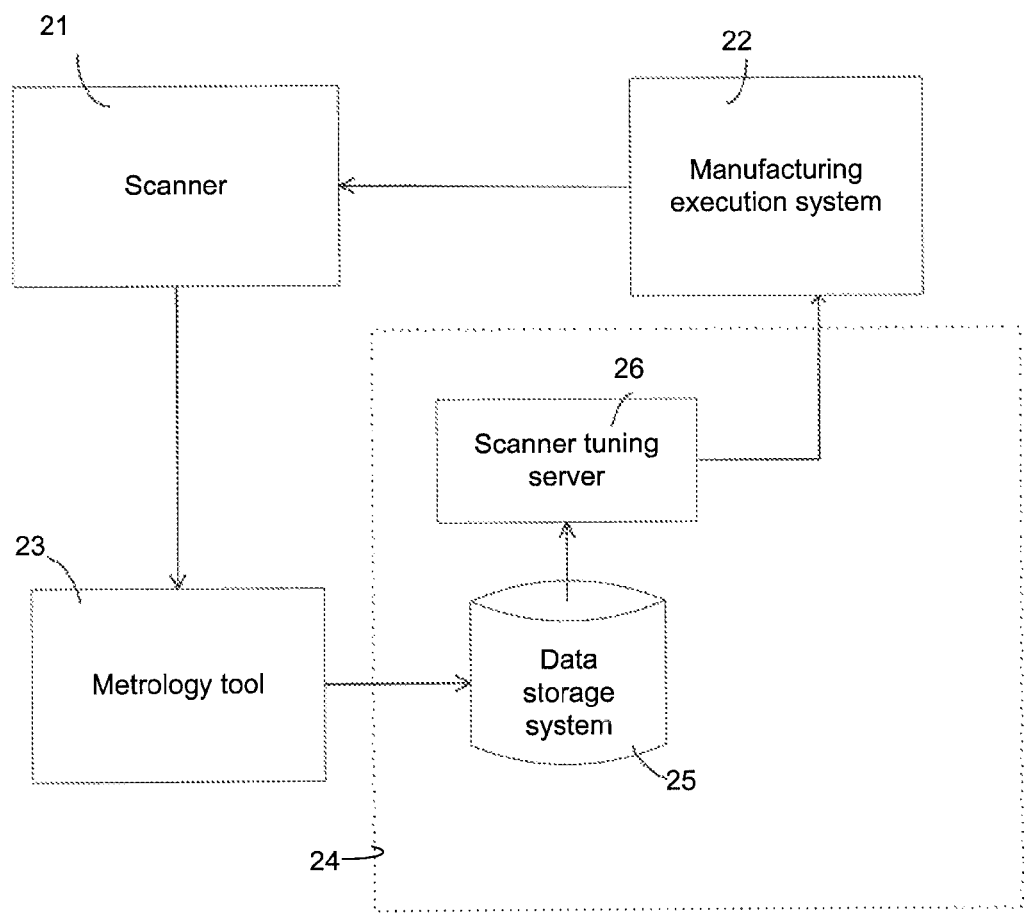
FIG. 9 illustrates a further lithography system which may be used in a method, according to an embodiment of the present invention.

FIG. 9 illustrates a further lithography system which may be used in a method, according to an embodiment of the present invention. In one example, the lithography system may be used in such a mode, equivalent features to those depicted in FIG. 2 being correspondingly labeled. In one example, a control loop is set up using the output of the scanner-tuning server to provide an input to the manufacturing execution system 22. Repetitive measurements of one or more particular features may be made, for example of focus using measurements of, for example, the SWA of a test pattern on the wafers exposed by the scanner 21. The stability and/or the validity of the scanner 21 can thus be monitored, if required automatically.

It will be appreciated that by measurement of the profile parameter(s) in addition to the measurement of the CD, the matching of two lithographic apparatus may be made more accurate as there is a better determination of the scanner sensitivities. The "to-be-matched" lithographic apparatus may be better directed to the required matching set point as a better discrimination between various scanner parameters can be made.

It will also be appreciated that many of the machine settings can be matched by monitoring of appropriate features on the pattern transferred to the wafer. Such machine settings include the ellipticity of the projection beam, laser bandwidth, focus drilling and oscillations applied to the wafer table.

It will also be appreciated that while in the embodiments of the invention described above, a scatterometer is used as the metrology tool, other metrology tools may be used, for example an SEM measurement tool or an atomic force microscope. A scatterometer however typically has got a shorter measurement time allowing the matching performance to be made faster.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A lithographic system, comprising:
a monitored lithographic projection apparatus arranged to project a patterned beam of radiation onto a substrate;
a metrology apparatus arranged to measure values representative of a plurality of features of a pattern transferred onto the substrate including values of at least one CD-profile parameter and at least one further feature profile parameter which is indicative of a machine setting of the monitored lithographic projection apparatus; and
a matching system comprising,
a storage system configured to store a reference CD-profile parameter value representative of the CD-profile parameter and a reference feature profile value representative of the one further feature profile parameter,
a comparison system configured to compare the measured and reference values of the one further feature profile parameter, and
a lithographic parameter determination system configured to determine a corrected set of machine settings for use by the monitored lithographic apparatus dependent on the differences between the measured and reference values of the one further feature profile parameter and between the measured and reference values of the CD-profile parameter.

2. The system according to claim 1, wherein the machine settings comprise focus setting of the test substrate, exposure dose, illumination setting, or numerical aperture.

3. The system according to claim 2, wherein the feature profile parameter is side wall angle and the machine setting is focus.

4. The system according to claim 2, further comprising a correlating system configured to correlate an arrangement for correlating the CD measurements to the exposure dose.

5. The system according to claim 1, wherein the test substrate includes at least one dedicated parameter sensitive target effective to allow a measurement to be made of the one further feature profile parameter distinct from other feature profile parameters.

6. The system according to claim 1, wherein the reference CD values and the reference values of the one further feature profile parameters are based on measurements of a substrate on which a pattern has been produced by a reference lithographic projection apparatus.

7. The system according to claim 1, wherein the reference CD values and the reference values of the one further feature profile parameter are based on measurements of a substrate on which a pattern has previously been produced by the monitored lithographic projection apparatus.

8. A matching system comprising:
a storage system configured to store measured and reference CD-profile parameter values representative of a CD-profile parameter and measured and reference feature profile values representative of one further feature profile parameter which is indicative of a machine setting of a monitored lithographic projection apparatus;
a comparator configured to compare measured and reference values of the one further feature profile parameter; and
a lithographic parameter determining device configured to determine a corrected set of machine settings for use by the monitored lithographic apparatus dependent on the differences between the measured and reference values of the one further feature profile parameter and between the measured and reference values of the CD-profile parameter.

9. The system according to claim 8, wherein the machine settings comprise focus setting of the test substrate, exposure dose, illumination setting, or numerical aperture.

10. The system according to claim 9, wherein the feature profile parameter is side wall angle and the machine setting is focus.

11. The system according to claim 9, further comprising a correlating system configured to correlate an arrangement for correlating the CD measurements to the exposure dose.

12. The system according to claim 8, wherein the test substrate includes at least one dedicated parameter sensitive target effective to allow a measurement to be made of the one further feature profile parameter distinct from other feature profile parameters.

13. The system according to claim 8, wherein the reference CD values and the reference values of the one further feature profile parameters are based on measurements of a substrate on which a pattern has been produced by a reference lithographic projection apparatus.

14. The system according to claim 8, wherein the reference CD values and the reference values of the one further feature profile parameter are based on measurements of a substrate on which a pattern has previously been produced by the monitored lithographic projection apparatus.

\* \* \* \* \*